(12) United States Patent
Lee et al.

(10) Patent No.: US 7,148,560 B2
(45) Date of Patent: Dec. 12, 2006

(54) IC CHIP PACKAGE STRUCTURE AND UNDERFILL PROCESS

(75) Inventors: Hsin-Hui Lee, Hsin-Chu (TW); Chien-Hsiun Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 4 days.

(21) Appl. No.: 11/043,602

(22) Filed: Jan. 25, 2005

(65) Prior Publication Data
US 2006/0163749 A1   Jul. 27, 2006

(51) Int. Cl.
*H01L 23/495* (2006.01)
*H01L 23/48* (2006.01)

(52) U.S. Cl. .............. 257/667; 257/778; 257/783; 257/753; 257/E23.127; 257/E23.16; 257/E21.514

(58) Field of Classification Search ............ 257/667, 257/783, 753, 778, E23.127, E23.16, E21.514
See application file for complete search history.

(56) References Cited

U.S. PATENT DOCUMENTS

| | | | |
|---|---|---|---|
| 5,311,060 A * | 5/1994 | Rostoker et al. ............ 257/796 |
| 6,376,923 B1 * | 4/2002 | Sumita et al. ............... 257/791 |
| 6,459,144 B1 * | 10/2002 | Pu et al. ..................... 257/667 |
| 6,465,743 B1 * | 10/2002 | Owens ........................ 174/260 |
| 6,933,173 B1 * | 8/2005 | Yunus ......................... 438/110 |

FOREIGN PATENT DOCUMENTS

JP        63-62362     *  3/1988   ................ 257/787

* cited by examiner

*Primary Examiner*—Jasmine Clark
(74) *Attorney, Agent, or Firm*—Tung & Associates

(57) ABSTRACT

A novel integrated circuit (IC) chip package structure and underfill process which reduces stress applied to corners of a flip chip in an IC package structure during the application of an adhesive material between the flip chip and a carrier substrate is disclosed. The process includes providing a dam structure on a carrier substrate; attaching solder bumps of an inverted flip chip to the carrier substrate; injecting an adhesive material between the flip chip and the carrier substrate at multiple injection points located along adjacent edges of the flip chip; and injecting a sealant material around the adhesive material. During application of the adhesive material and the sealant material to the IC package structure in the underfill process, the dam structure reduces stress applied to the corners of the flip chip. This prevents or at least reduces de-lamination of dielectric layers on the flip chip.

18 Claims, 5 Drawing Sheets

IC CHIP PACKAGE STRUCTURE AND UNDERFILL PROCESS

FIELD OF THE INVENTION

The present invention relates to flip chip packaging of integrated circuit (IC) semiconductor assemblies. More particularly, the present invention relates to a novel IC chip package structure and underfill process for an IC chip package structure which utilizes dams in conjunction with directional injection of an underfill bonding material between a chip and a substrate to prevent or reduce de-lamination of intermetal dielectric (IMD) layers on a ball grid array (BGA) flip chip during IC chip package assembly.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

FIG. 1 illustrates a cross-section of a conventional BGA integrated circuit (IC) package structure 8 having a flip chip 10 which is inverted and bonded to a carrier substrate 20, such as a printed circuit board (PCB), for example. Fabrication of the flip chip 10 is begun by forming multiple bonding pads 16 on the surface of a chip substrate 12, in electrical contact with integrated circuits (not shown) fabricated on the chip substrate 12. A solder bump 18 is then bonded to each of the bonding pads 16. Each of the solder bumps 18 is typically spherical in configuration and extends through a passivation layer 14 formed on the surface of the chip substrate 12. A tin oxide layer 19 may coat the surface of each solder bump 18.

In assembly of the IC package structure 8, the flip chip 10 is subjected to a re-flow temperature of typically about 320° C. to re-flow the lead solder bumps 18 on the chip substrate 12. The flip chip 10 is then inverted and the solder bumps 18 are bonded with respective bond pads (not shown) on the carrier substrate 20. The re-flow heat partially melts the tin oxide layer 19 and bonds the underlying lead solder bumps 18 to the carrier substrate 20.

In an underfill process, an adhesive material 22, such as an epoxy, for example, is provided between the carrier substrate 20 and the chip substrate 12. As shown in FIG. 2A, the adhesive material 22 is initially dispensed in liquid form from a dispenser 24 onto the carrier substrate 20, at one corner of the flip chip 10. The adhesive material 22 is then drawn by capillary action between the carrier substrate 20 and the chip substrate 12, as shown in FIG. 2B. The hardened adhesive material 22, which typically has a high Young's modulus, attaches the flip chip 10 to the carrier substrate 20 and protects the solder bumps 18 from cracking in the finished IC package structure 8. A sealant material 23 is applied to the IC package structure 8, around the adhesive material 22. The hardened sealant material 23 has a low Young's modulus to prevent de-lamination of low dielectric constant intermetal dielectric (IMD) layers (not shown) on the chip substrate 12 during application.

During application of the adhesive material 22 to the IC package structure 8, stresses are applied to the brittle IMD layers (not shown) on the chip substrate 12. This frequently results in de-lamination of the IMD layer or layers, particularly at the corner of the flip chip 10 where the adhesive material 22 is applied. Accordingly, a novel underfill process is needed to prevent or reduce stresses applied to a flip chip, and particularly, to prevent de-lamination of low-k dielectric layers on a chip during application of an adhesive material to the structure.

An object of the present invention is to provide a novel underfill process for assembling a flip-chip integrated circuit package structure.

Another object of the present invention is to provide a novel underfill process which reduces stress on a flip chip during application of an adhesive material between the flip chip and a carrier substrate of the IC structure.

Still another object of the present invention is to provide a novel underfill process which reduces stress applied to a flip chip, which process includes providing a dam structure on a carrier substrate; attaching solder bumps of a flip chip to the carrier substrate; injecting an adhesive material between the flip chip and the carrier substrate at multiple injection points located along the edges of the flip chip; and injecting a sealant material around the adhesive material, wherein the dam structure reduces stress applied to the corners of the flip chip during the underfill process.

SUMMARY OF THE INVENTION

In accordance with these and other objects and advantages, the present invention is generally directed to a novel underfill process for reducing stress applied to corners of a flip chip in an IC package structure during the application of an adhesive material between the flip chip and a carrier substrate. The process includes providing a dam structure on a carrier substrate; attaching solder bumps of an inverted flip chip to the carrier substrate; injecting an adhesive material between the flip chip and the carrier substrate at multiple injection points located along adjacent edges of the flip chip; and injecting a sealant material around the adhesive material. During application of the adhesive material and the sealant material to the IC package structure in the underfill process, the dam structure reduces stress applied to the corners of the flip chip. This prevents or at least reduces de-lamination of dielectric layers on the flip chip.

The present invention further includes an integrated circuit chip structure having a carrier substrate; multiple dam elements provided on the carrier substrate; and a flip chip attached to the carrier substrate, with respective corners of the flip chip disposed adjacent to the respective dam elements. During assembly of the IC chip structure, an adhesive material is injected at multiple injection points at respective edges of the flip chip to reduce stress at the corners of the flip chip. A sealant material is provided around the adhesive material.

BRIEF DESCRIPTION OF THE DRAWINGS

The invention will now be described, by way of example, with reference to the accompanying drawings, in which.

DETAILED DESCRIPTION OF THE INVENTION

The present invention generally contemplates a novel underfill process for reducing stress applied to corners of a flip chip in assembly of an IC package structure, particularly during the application of an adhesive material between the flip chip and a carrier substrate. According to the process, a dam structure is provided on a carrier substrate. The dam structure typically includes multiple dam elements provided adjacent to respective corners of the carrier substrate. A flip chip having multiple solder bumps is then inverted, and the solder bumps on the flip chip are bonded to the carrier substrate. A high-stress modulus adhesive material, which is typically an epoxy resin, is injected between the flip chip and the carrier substrate at multiple injection points located along respective edges of the flip chip. Finally, a low-stress modulus sealant material, which is typically an epoxy resin containing rosin, is injected around the adhesive material. As the adhesive material and the sealant material are applied to the IC package structure during the underfill process, the dam elements of the dam structure reduce stress applied to the corners of the flip chip. This prevents or at least reduces de-lamination of dielectric layers, particularly brittle intermetal dielectric (IMD) layers having a low dielectric constant, on the flip chip.

The present invention further includes an integrated circuit chip structure having a carrier substrate and multiple dam elements provided on the carrier substrate. A flip chip having multiple solder bumps is attached to the carrier substrate, with respective corners of the flip chip disposed adjacent to the respective dam elements. A high-stress modulus adhesive material is provided between the carrier substrate and the flip chip. During assembly of the IC chip structure, the adhesive material is injected at multiple injection points at respective edges of the flip chip to reduce stress at the corners of the flip chip. A low-stress modulus sealant material is provided around the high-stress modulus adhesive material.

Figure 1:
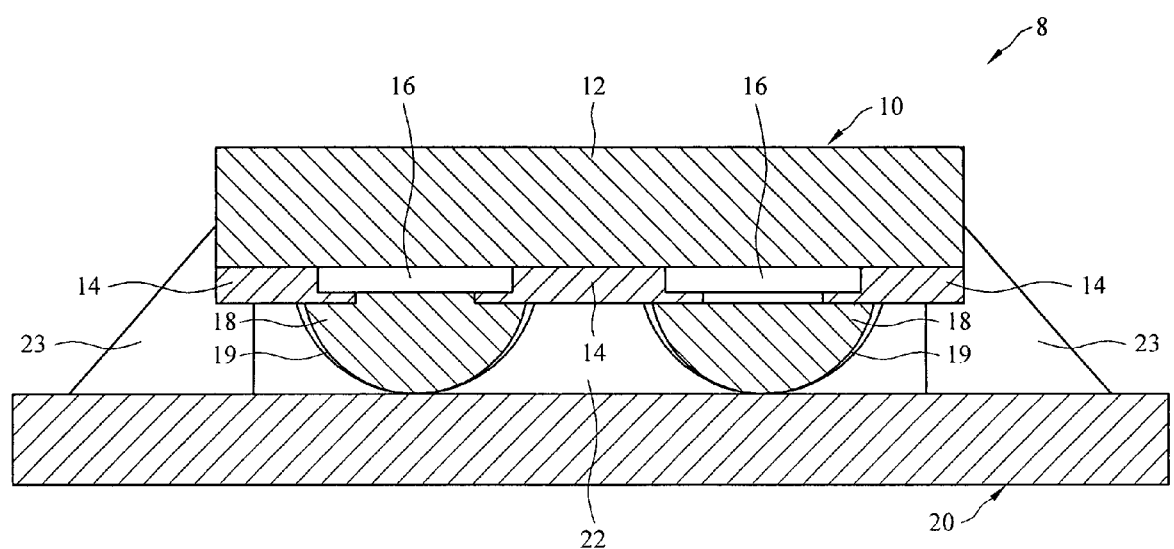
FIG. 1 is a cross-section of a portion of a conventional BGA (ball grid array) integrated circuit (IC) package structure, with a flip chip attached to a carrier substrate.
Figure 2A:
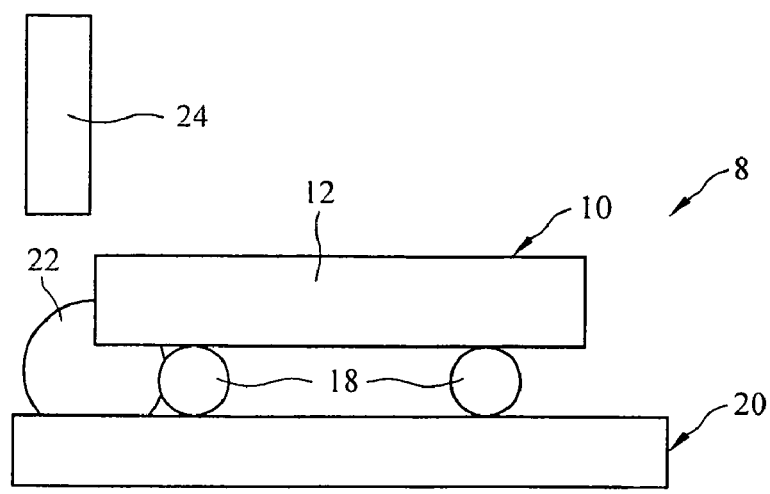
FIGS. 2A and 2B are cross-sectional views illustrating a typical conventional underfill process for attaching a flip chip to a carrier substrate.
Figure 2B:
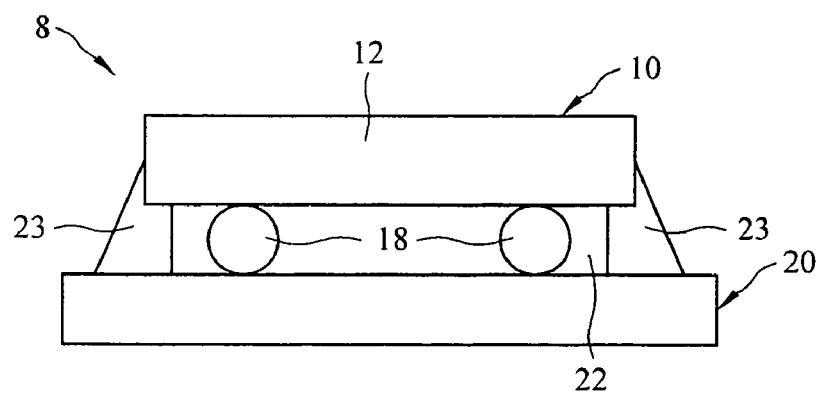
Figure 3A:
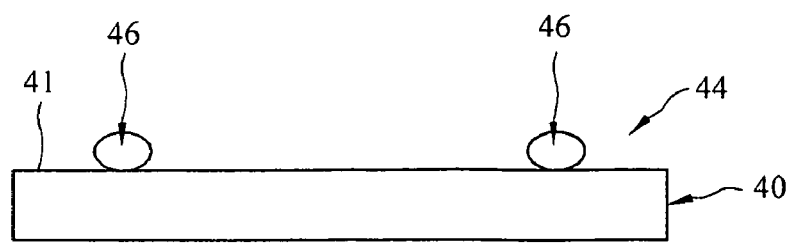
FIGS. 3A–3D are cross-sectional views illustrating sequential steps in an underfill process carried out according to the present invention.

Referring to FIGS. 3A–3D and FIG. 4, assembly of an IC chip package structure 28 (FIGS. 3D and 4) according to the process of the present invention is begun by providing a carrier substrate 40. The carrier substrate 40 may be a printed circuit board (PCB), for example, and serves to electrically connect a flip chip 30 to higher-level electronic structures in an electronic product (not shown), typically in conventional fashion. As shown in FIG. 3A, a dam structure 44 is initially provided on the bonding surface 41 of the carrier substrate 40, to which bonding surface 41 the flip chip 30 will subsequently be attached in assembly of the IC chip package structure 28, as will be hereinafter described.

Figure 4:
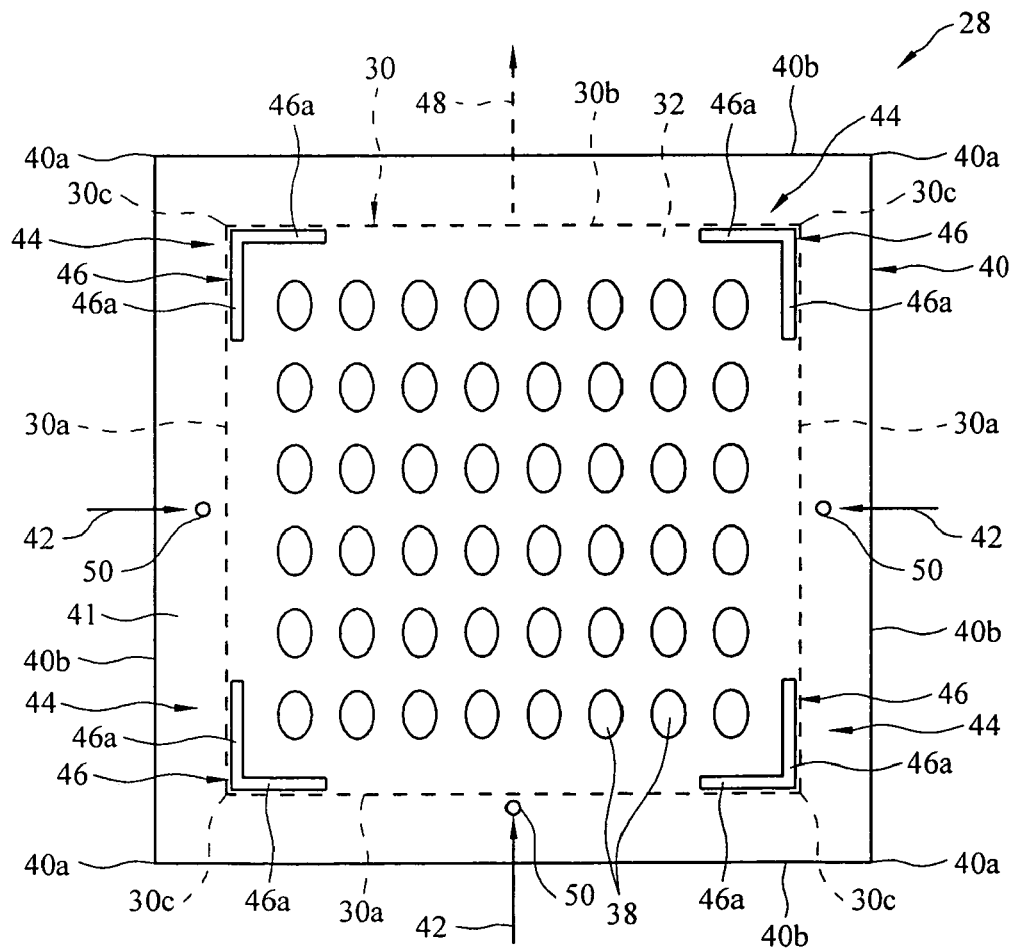
FIG. 4 is a top view of an IC package structure fabricated according to the underfill process of the present invention.

The dam structure 44 is typically an epoxy resin and, as shown in FIG. 4, may include multiple dam elements 46 provided on the bonding surface 41, adjacent to respective corners 40a of the carrier substrate 40. Each dam element 46 preferably is generally L-shaped and includes a pair of element segments 46a which are provided in substantially perpendicular relationship to each other and extend generally parallel to a corresponding edge 40b of the carrier substrate 40. The dam elements 46 prevent or reduce de-lamination of dielectric layers (not shown) provided on the chip substrate 32 of the flip chip 30 during assembly of the IC chip package structure 28, as will be hereinafter described.

The flip chip 30 includes multiple solder bumps 38 which are typically lead and are bonded to respective bond pads 36 (FIGS. 3B–3D) provided on a chip substrate 32. A tin oxide layer (not shown) may cover the surface of each solder bump 38. An electrically-insulating passivation layer 34 typically surrounds the bond pads 36 and protects the surface of the chip substrate 32. As is known by those skilled in the art, throughout the course of chip fabrication, integrated circuits (not shown) are sequentially formed on the chip substrate 32 which, along with many other chip substrates 32, initially forms a small part of a silicon semiconductor wafer. At the end of chip fabrication, the individual die, or flip chips 30, are cut or diced from the semiconductor wafer. The bond pads 36 are attached to the integrated circuits on the chip substrate 32, and the solder bumps 38 are formed on the respective bond pads 36. Accordingly, through the bond pads 36, the solder bumps 38 are disposed in electrical communication with the integrated circuits on the chip substrate 32.

Figure 3B:
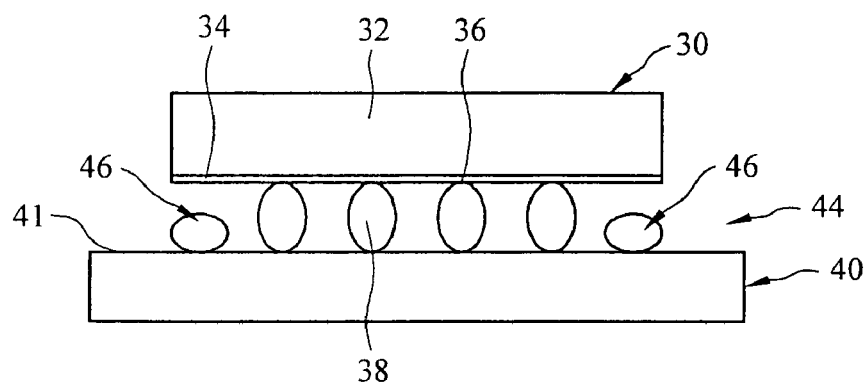

As shown in FIG. 3B, the flip chip 30 is next inverted and bonded to the bonding surface 41 of the carrier substrate 40. Prior to the bonding step, the flip chip 30 is typically subjected to a re-flow temperature of typically about 320° C. to re-flow the lead solder bumps 38. The flip chip 30 is then inverted and the solder bumps 38 are bonded to respective bond pads (not shown) provided on the carrier substrate 40. The re-flow heat partially melts the tin oxide layer (not shown) on each solder bump 38 and bonds the lead solder bump 38 to the bond pads (not shown) on the carrier substrate 40. As shown in FIG. 4, the edges 30a, 30b of the flip chip 30 (shown in phantom) are typically positioned directly above and in substantially parallel relationship to the respective element segments 46a on each dam element 46 of the dam structure 44.

Figure 3C:
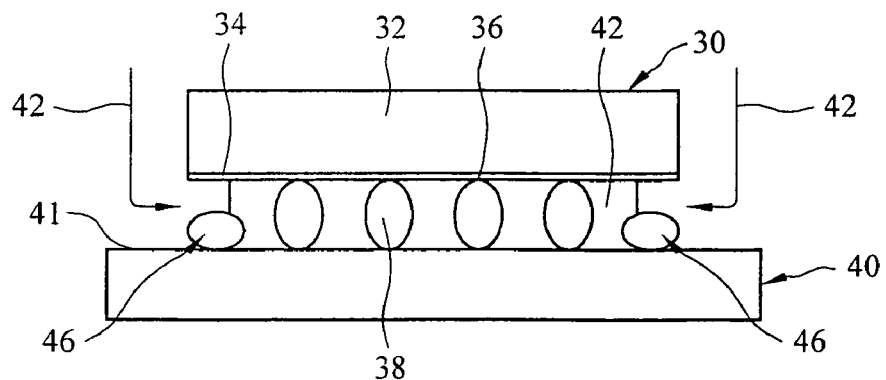

As shown in FIG. 3C, a high-stress modulus adhesive material 42, which may be conventional, is next injected between the flip chip 30 and the carrier substrate 40. The adhesive material 42 is typically an epoxy resin and attaches the chip substrate 32 to the carrier substrate 40, as well as prevents or reduces cracking of the soft lead solder bumps 38 in the assembled IC chip package structure 28. As shown in FIG. 4, the adhesive material 42 is preferably applied at each of multiple injection points 50 located along three respective adjacent edges 30a of the chip substrate 30. Preferably, the adhesive material 42 is not injected at the remaining edge 30b of the flip chip 30.

As it is injected between the flip chip 30 and the carrier substrate 40 at the respective injection points 50, the liquid adhesive material 42 is drawn by capillary action among and between the solder bumps 38. Simultaneously, the flowing adhesive material 42 expels air 48 (shown in phantom) from between the flip chip 30 and the carrier substrate 40, along the remaining edge 30b of the flip chip 30. The location of the injection points 50 along the three respective edges 30a of the flip chip 30, in combination with the protective presence of the dam elements 46 of the dam structure 44 at the respective corners 30c of the flip chip 30, prevents the flowing adhesive material 42 from de-laminating dielectric layers (not shown) provided on the chip substrate 32, particularly the de-lamination of intermetal dielectric (IMD) layers having a low dielectric constant.

Figure 3D:
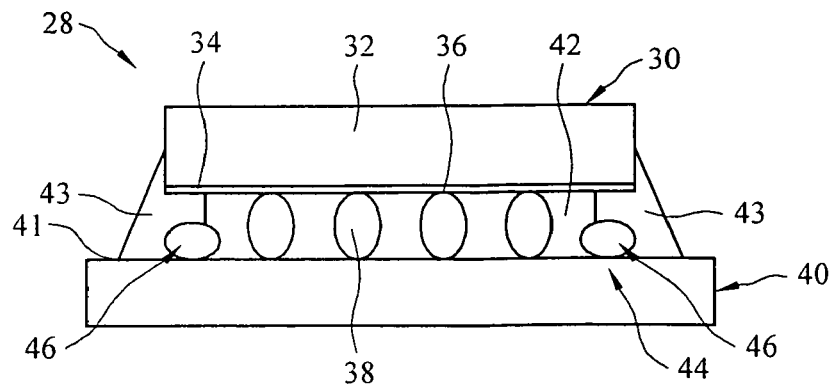

As shown in FIG. 3D, after hardening and curing of the adhesive material 42, a low-stress modulus sealant material 43, which may be conventional, is injected around the adhesive material 42. The sealant material 43 is typically an epoxy resin which contains rosin. The carrier substrate 40 of the assembled IC chip package 28 is then provided in electrical contact with higher-level electronic structures (not shown) in assembly of an electronic product (not shown), according to the knowledge of those skilled in the art. The sealant material 43 thermally and electrically isolates the solder bumps 38 from outside elements in the electronic product during functioning of the IC chip package structure 28.

Figure 5:
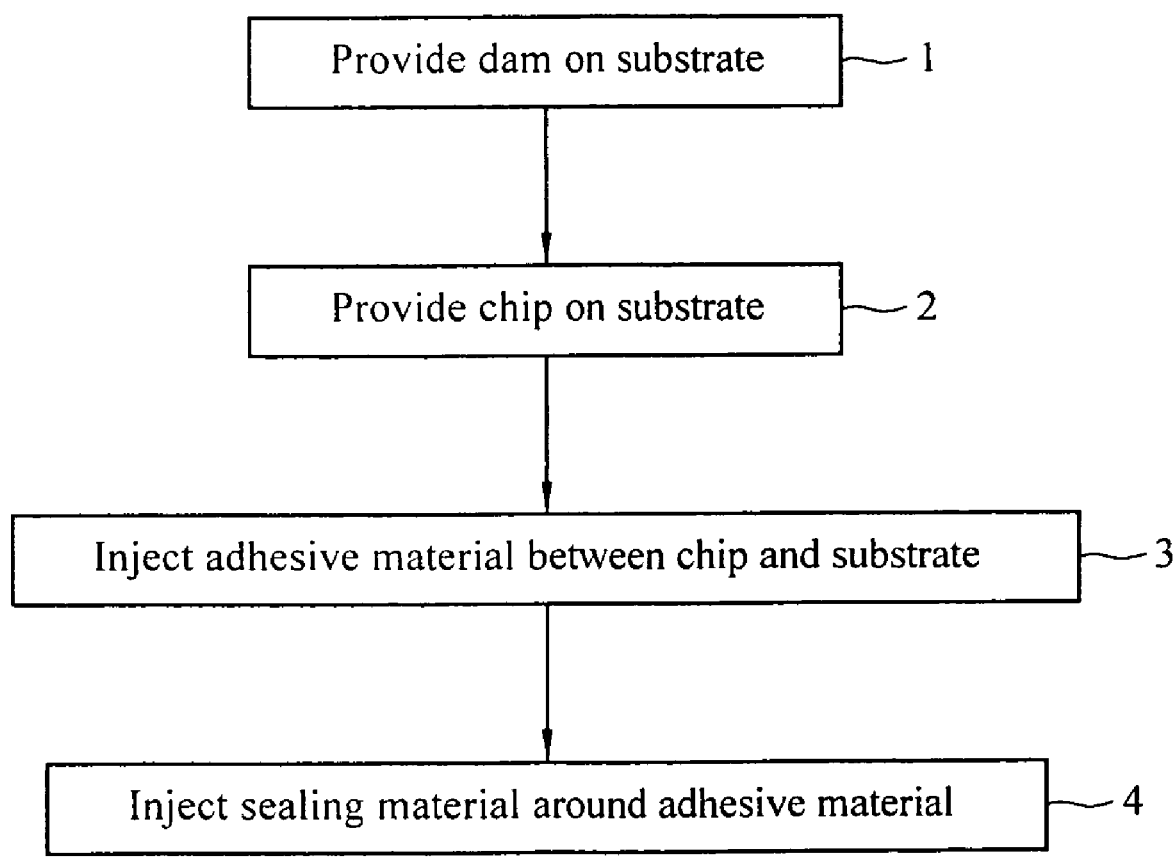
FIG. 5 is a flow diagram which summarizes sequential process steps carried out according to the underfill process of the present invention.

The flow diagram of FIG. 5 summarizes sequential process steps carried out according to the process of the present invention. As indicated in step 1, a dam structure is initially provided on a carrier substrate such as a printed circuit board (PCB). As indicated in step 2, a flip chip having solder bumps is inverted, and the solder bumps are bonded to respective bond pads on the carrier substrate. As indicated in step 3, a high-stress modulus adhesive material is injected between the flip chip and the carrier substrate to attach the chip substrate to the carrier substrate and protect the solder bumps from cracking. The dam structure on the carrier substrate prevents concentration of excessive stress at the corners of the flip chip during application of the adhesive material. As indicated in step 4, a low-stress modulus sealing material is next injected around the adhesive material to thermally and electrically insulate the solder bumps from outside elements.

While the preferred embodiments of the invention have been described above, it will be recognized and understood that various modifications can be made in the invention and the appended claims are intended to cover all such modifications which may fall within the spirit and scope of the invention.

What is claimed is:

1. An integrated circuit chip structure comprising:
a carrier substrate;
a flip chip provided on said substrate;
a dam structure provided on said carrier substrate and disposed adjacent to respective corners of said flip chip; and
an adhesive material provided between said carrier substrate and said flip chip.

2. The integrated circuit chip structure of claim 1 wherein said adhesive material comprises an epoxy resin.

3. The integrated circuit chip structure of claim 1 wherein said carrier substrate comprises a printed circuit board.

4. The integrated circuit chip structure of claim 1 wherein said adhesive material is a high stress modulus material.

5. The integrated circuit chip structure of claim 1 wherein said adhesive material is injected at a plurality of injection points at a plurality of edges, respectively, of said flip chip.

6. The integrated circuit chip structure of claim 1 wherein said dam structure comprises an epoxy resin.

7. The integrated circuit chip structure of claim 1 wherein said dam structure comprises a plurality of dam elements.

8. An integrated circuit chip structure comprising:
a carrier substrate and a generally rectangular flip chip provided on said carrier substrate;
a dam structure provided on said carrier substrate, said dam structure comprises a plurality of dam elements provided at respective corners of said flip chip and wherein each of said dam elements comprises an epoxy resin;
an adhesive material provided between said carrier substrate and said flip chip; and
a sealant material provided around said adhesive material.

9. The integrated circuit chip structure of claim 8 wherein said adhesive material comprises an epoxy resin.

10. The integrated circuit chip structure of claim 8 wherein said carrier substrate comprises a printed circuit board.

11. The integrated circuit chip structure of claim 8 wherein said adhesive material is injected at three injection points at three edges of said flip chip.

12. The integrated circuit chip structure of claim 8 wherein sealant comprises an epoxy resin.

13. The integrated circuit chip structure of claim 8 wherein said dam structure comprises an epoxy resin.

14. The integrated circuit chip structure of claim 8 wherein said dam structure comprises a plurality of dam elements having an L-shaped configuration.

15. An integrated circuit chip structure, comprising:
a carrier substrate;
a plurality of dam elements provided on said carrier substrate;

a flip chip attached to said carrier substrate, with respective corners of said flip chip disposed adjacent to said dam elements, respectively;

an adhesive material provided between said carrier substrate and said flip chip; and a sealant material provided around said adhesive material.

16. The integrated circuit chip structure of claim 15 wherein said adhesive material comprises an epoxy resin.

17. The integrated circuit chip structure of claim 15 wherein said carrier substrate comprises a printed circuit board.

18. The integrated circuit chip structure of claim 15 wherein each of said dam elements comprises a pair elements segments disposed in generally perpendicular relationship to each other.

* * * * *